(12) United States Patent
Yokoyama et al.

(10) Patent No.: US 11,532,738 B2
(45) Date of Patent: Dec. 20, 2022

(54) SEMICONDUCTOR DEVICE

(71) Applicant: FUJI ELECTRIC CO., LTD., Kanagawa (JP)

(72) Inventors: Kouta Yokoyama, Matsumoto (JP); Toru Ajiki, Matsumoto (JP); Kaname Mitsuzuka, Matsumoto (JP); Tohru Shirakawa, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 252 days.

(21) Appl. No.: 16/910,107

(22) Filed: Jun. 24, 2020

(65) Prior Publication Data
US 2021/0043758 A1 Feb. 11, 2021

(30) Foreign Application Priority Data
Aug. 9, 2019 (JP) .............................. JP2019-147282

(51) Int. Cl.
| | |
|---|---|
| *H01L 29/739* | (2006.01) |
| *H01L 29/10* | (2006.01) |
| *H01L 29/861* | (2006.01) |
| *H01L 27/06* | (2006.01) |
| *H01L 29/06* | (2006.01) |
| *H01L 29/423* | (2006.01) |

(52) U.S. Cl.
CPC ...... *H01L 29/7397* (2013.01); *H01L 27/0629* (2013.01); *H01L 29/0692* (2013.01); *H01L 29/1095* (2013.01); *H01L 29/4238* (2013.01); *H01L 29/861* (2013.01)

(58) Field of Classification Search
CPC ............. H01L 29/7397; H01L 29/0692; H01L 29/861; H01L 29/1095; H01L 29/4238; H01L 27/0629
See application file for complete search history.

(56) References Cited

U.S. PATENT DOCUMENTS

| | | | |
|---|---|---|---|
| 10,128,230 B2 | 11/2018 | Shirakawa | |
| 2010/0276727 A1 | 11/2010 | Storasta | |
| 2018/0197977 A1* | 7/2018 | Kouno | ................ H01L 27/0664 |
| 2019/0096878 A1* | 3/2019 | Arakawa | ............. H01L 29/0619 |
| 2020/0365715 A1* | 11/2020 | Yoshida | ............ H01L 21/26513 |

FOREIGN PATENT DOCUMENTS

| | | |
|---|---|---|
| JP | 2010263215 A | 11/2010 |
| JP | 2013138069 A | 7/2013 |
| JP | 2018046187 A | 3/2018 |
| JP | 2018078153 A | 5/2018 |

* cited by examiner

*Primary Examiner* — Joseph C. Nicely

(57) ABSTRACT

Provided is a semiconductor device that includes a semiconductor substrate that is provided with a first conductivity type drift region, a transistor portion that includes a second conductivity type collector region in contact with a lower surface of the semiconductor substrate, and a diode portion that includes a first conductivity type cathode region in contact with the lower surface of the semiconductor substrate, and is alternately disposed with the transistor portion along an arrangement direction in an upper surface of the semiconductor substrate. In the transistor portions, a width in the arrangement direction of two or more transistor portions sequentially selected from the transistor portions nearer to the center in the arrangement direction of the semiconductor substrate is larger than a width in the arrangement direction of one of the other transistor portions.

14 Claims, 10 Drawing Sheets

SEMICONDUCTOR DEVICE

The contents of the following Japanese patent application are incorporated herein by reference:
NO. 2019-147282 filed in JP on Aug. 9, 2019.

BACKGROUND

1. Technical Field

The present invention relates to a semiconductor device.

2. Related Art

Conventionally, there is known a reversely conductive semiconductor device in which a transistor portion such as an IGBT (Insulated Gate Bipolar Transistor) in one semiconductor substrate and a diode portion such as an FWD (Freewheeling Diode) are formed (for example, see Patent Literatures 1 to 3).

Patent Literature 1: Japanese Patent Application Publication No. 2018-46187
Patent Literature 2: Japanese Patent Application Publication No. 2013-138069
Patent Literature 3: Japanese Patent Application Publication No. 2018-78153

In a semiconductor device, a temperature of the center portion of a substrate tends to increase.

SUMMARY

In an aspect of the invention to solve the above problems, a semiconductor device is provided which includes a semiconductor substrate provided with a first conductivity type drift region. The semiconductor device may be provided with a transistor portion which includes a second conductivity type collector region in contact with a lower surface of the semiconductor substrate. The semiconductor device may be provided with a diode portion that includes the first conductivity type cathode region in contact with the lower surface of the semiconductor substrate, and is alternately disposed with the transistor portion along an arrangement direction in an upper surface of the semiconductor substrate. In the transistor portions, a width in the arrangement direction of two or more transistor portions sequentially selected from the transistor portions near a center in the arrangement direction of the semiconductor substrate may be larger than a width in the arrangement direction of one of the other transistor portions.

In the transistor portions, each of two or more first transistor portions sequentially selected from the transistor portions near a center in the arrangement direction of the semiconductor substrate may have a first width in the arrangement direction. In the transistor portions, each of two or more second transistor portions disposed further away from the center than the first transistor portion may have a second width smaller than the first width in the arrangement direction.

A value obtained by dividing the second width by the first width may be larger than 0.5. A value obtained by dividing the second width by the first width may be smaller than 1.

The first width may be larger than 700 µm. The first width may be smaller than 1100 µm.

A width in the arrangement direction of each of the diode portions may be larger than 300 µm.

A width in the arrangement direction of each of the diode portions may be 2.5 times bigger than a thickness of the semiconductor substrate.

Each of the diode portions may have the same width in the arrangement direction.

In the transistor portions, a width in the arrangement direction of the first transistor portion nearest to the center in the arrangement direction of the semiconductor substrate may be larger than a width in the arrangement direction of the second transistor portion further away from the center than the first transistor portion. A width in the arrangement direction of the second transistor portion may be larger than a width in the arrangement direction of a third transistor portion further away from the center than the second transistor portion.

The semiconductor device may be provided with an outer peripheral diode portion in the upper surface of the semiconductor substrate, which is provided to surround a region where the transistor portion and the diode portion are alternately disposed along the arrangement direction.

The semiconductor device may be provided with a gate pad that is electrically connected to the transistor portion. A distance in the arrangement direction between the diode portion nearest to the gate pad and the gate pad may be larger than a width in the arrangement direction of the diode portion.

An oxygen concentration in the semiconductor substrate may be $1.0 \times 10^{17}/cm^3$ or more.

The semiconductor device may be provided with a first conductivity type buffer region that is provided between the drift region and a lower surface of the semiconductor substrate, contains hydrogen, and has a plurality of concentration peaks having a doping concentration higher than the drift region in a depth direction of the semiconductor substrate.

A crystal defect density distribution in a depth direction of the semiconductor substrate may have a defect density peak that is disposed between the concentration peaks in the buffer region.

The summary clause does not necessarily describe all necessary features of the embodiments of the present invention. The present invention may also be a sub-combination of the features described above.

Figure 1:
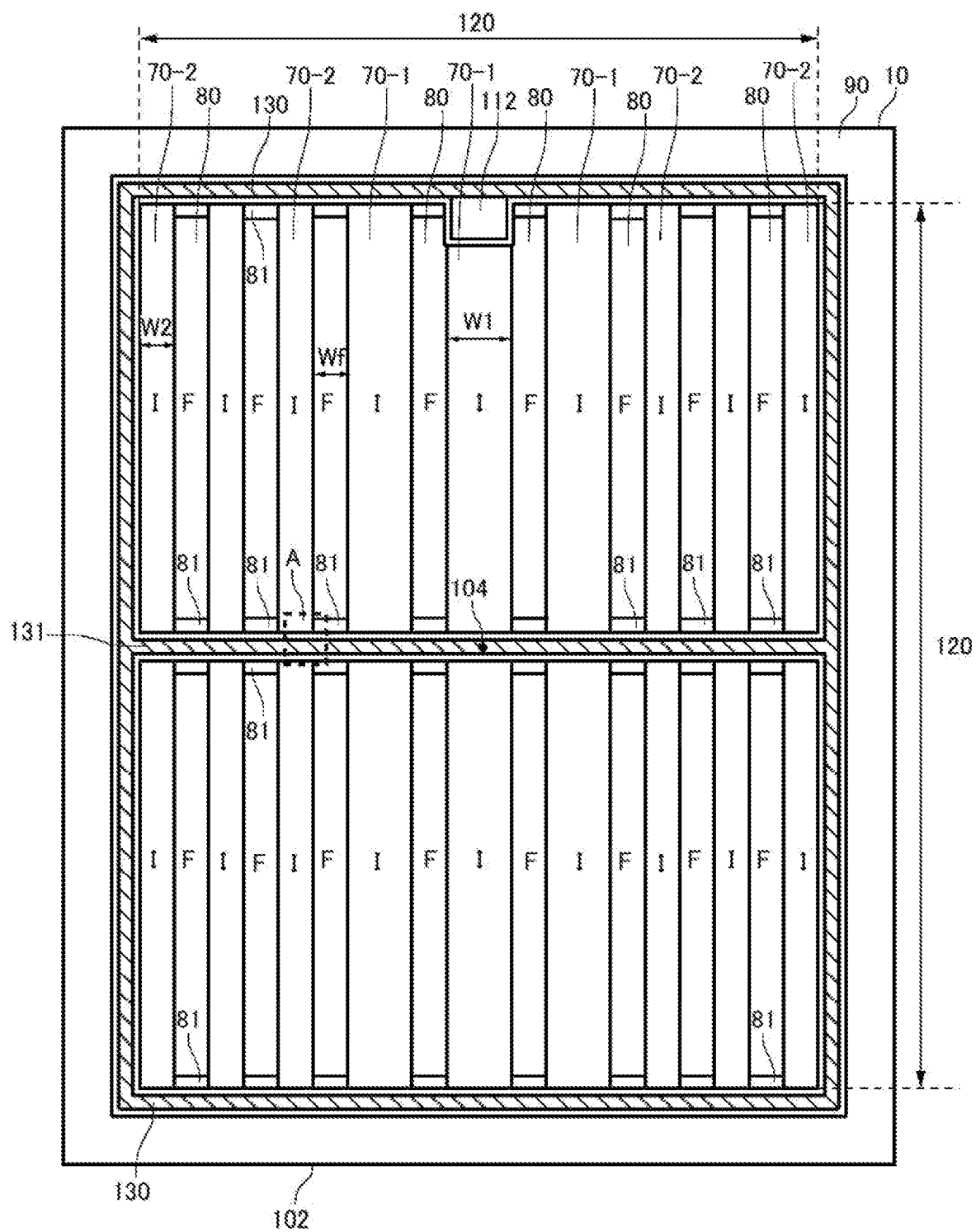
FIG. 1 is a top view illustrating an example of a semiconductor device 100 according to an embodiment of the invention.

DESCRIPTION OF EXEMPLARY
EMBODIMENTS

Hereinafter, the invention will be described through embodiments of the invention, but the following embodiments do not limit the invention according to claims. In addition, not all combinations of the features described in the embodiments are necessarily essential to the solution of the invention.

In this specification, one side in a direction parallel to the depth direction of a semiconductor substrate is referred to as "upper", and the other side is referred to as "lower". One of the two main surfaces of the substrate, layer, or other members is called an upper surface, and the other surface is referred to as a lower surface. The directions of "up" and "down" are not limited to the direction of gravity or the direction when a semiconductor device is mounted.

In this specification, technical matters may be described using orthogonal coordinate axes of an X axis, a Y axis, and a Z axis. The orthogonal coordinate axis is merely to specify a relative position of components, and does not limit a specific direction. For example, the Z axis is not limited to a height direction with respect to the ground surface. Further, a +Z axis direction and a −Z axis direction are directions opposite to each other. When the Z axis direction is described without describing the sign, it means that the direction is parallel to the +Z axis and the −Z axis. In this specification, viewing from the +Z axis direction may be referred to as "when viewed from the upper surface".

In the present specification, the term "same" or "equal" may include a case where there is an error due to manufacturing variation or the like. The corresponding error is within, for example, 10%.

In the present specification, the conductivity type of a doping region doped with impurities is described as a P type or an N type. However, the conductivity type of each doping region may also be of reversed polarity. In addition, in the present specification, the term P+ type or N+ type means that its doping concentration is higher than that of the P type or N type, and the term P− type or N− type means that its doping concentration is lower than that of the P type or N type. In addition, in the present specification, the term P++ type or N++ type means that its doping concentration is higher than that of the P+ type or N+ type.

The doping concentration in the present specification indicates a concentration of an impurity activated as a donor or an acceptor. In the present specification, a concentration difference between the donor and the acceptor may be referred to as a doping concentration. The concentration difference can be measured by a capacitance-voltage method (CV method). In addition, a carrier concentration measured by a spreading resistance method (SR) may be used as the doping concentration. In addition, in a case where a doping concentration distribution has a peak, the peak may be used as the doping concentration in the corresponding region. In a case where the doping concentration in a region where the donor or the acceptor exist is almost even, or the like, an average value of the doping concentration may be used as the doping concentration in the corresponding region. In addition, the dopant concentration in the present specification indicates a concentration of each of the donor and the acceptor.

FIG. 1 is a top view illustrating an example of a semiconductor device 100 according to an embodiment of the invention. FIG. 1 illustrates positions obtained by projecting members onto the upper surface of a semiconductor substrate 10. In FIG. 1, only some members of the semiconductor device 100 are illustrated, but some members are omitted.

The semiconductor device 100 is provided with the semiconductor substrate 10. The semiconductor substrate 10 is a substrate which is formed of a semiconductor material such as silicon or a compound semiconductor. The semiconductor substrate 10 includes an edge side 102 when viewed from the upper surface. In the case of simply mentioning "when viewed from the upper surface" in the present specification, it means viewing from the upper surface side of the semiconductor substrate 10. The semiconductor substrate 10 of this example includes two sets of edge sides 102 facing each other when viewed from the upper surface. In FIG. 1, the X axis and the Y axis are parallel with any of the edge sides 102. In addition, the Z axis is perpendicular to the upper surface of the semiconductor substrate 10.

In the semiconductor substrate 10, an active portion 120 is provided. The active portion 120 is a region in which a main current flows in the depth direction, between the upper surface and the lower surface of the semiconductor substrate 10 in a case where the semiconductor device 100 operates. On the upper side of the active portion 120, an emitter electrode is provided, but it is omitted in FIG. 1.

In the active portion 120, there is provided a transistor portion 70 which includes a transistor element such as an IGBT, and a diode portion 80 which includes a diode element such as a freewheeling diode (FWD). The transistor portion 70 and the diode portion 80 are disposed alternately along a predetermined arrangement direction (the X axis direction in this example) in the upper surface of the semiconductor substrate 10.

In FIG. 1, Symbol "I" is attached to the region where the transistor portion 70 is disposed, and Symbol "F" is attached to the region where the diode portion 80 is disposed. In the present specification, a direction perpendicular to the arrangement direction when viewed from the upper surface may be referred to as an extension direction (the Y axis direction in FIG. 1). The transistor portion 70 and the diode portion 80 may each include a longitudinal side in the extension direction. In other words, the length in the Y axis direction of the transistor portion 70 is larger than the width in the X axis direction. Similarly, the length in the Y axis direction of the diode portion 80 is larger than the width in the X axis direction. The extension direction of the transistor portion 70 and the diode portion 80 and the longitudinal direction of each trench portion described later may be the same.

The diode portion 80 includes an N+ type cathode region in a region in contact with the lower surface of the semiconductor substrate 10. In the present specification, the region where the cathode region is provided is referred to as the diode portion 80. 'In other words, the diode portion 80 is a region overlapping with the cathode region when viewed from the upper surface. In the lower surface of the semiconductor substrate 10, a P+ type collector region may be provided in the region other than the cathode region. In the present specification, an extension region 81 extending from the diode portion 80 to a gate runner described later in the Y axis direction may also be included in the diode portion 80. In the lower surface of the extension region 81, a collector region is provided.

The transistor portion 70 includes a P+ type collector region in a region in contact with the lower surface of the semiconductor substrate 10. In addition, in the transistor portion 70, there is periodically disposed a gate structure, which includes a gate conductive portion and a gate insulating film, on the upper surface side on the semiconductor substrate 10.

The semiconductor device 100 may include one or more pads on the upper side of the semiconductor substrate 10. The semiconductor device 100 of this example includes a gate pad 112. The semiconductor device 100 may also include pads such as an anode pad, a cathode pad, and a current detection pad. Each pad is disposed in the vicinity of the edge side 102. The vicinity of the edge side 102 indicates a region between the edge side 102 and the emitter electrode when viewed from the upper surface. When mounting the semiconductor device 100, each pad may be connected to an external circuit via a wiring such as a wire.

In the gate pad 112, a gate potential is applied. The gate pad 112 is electrically connected to the conductive portion of a gate trench portion of the active portion 120. The semiconductor device 100 is provided with a gate runner to connect the gate pad 112 and the gate trench portion. In FIG. 1, the gate runner is hatched with inclined lines.

The gate runner of this example includes an outer peripheral gate runner 130 and an active-side gate runner 131. The outer peripheral gate runner 130 is disposed between the active portion 120 and the edge side 102 of the semiconductor substrate 10 when viewed from the upper surface. The outer peripheral gate runner 130 of this example surrounds the active portion 120 when viewed from the upper surface. The region surrounded by the outer peripheral gate runner 130 when viewed from the upper surface may also be called the active portion 120. In addition, the outer peripheral gate runner 130 is connected to the gate pad 112. The outer peripheral gate runner 130 is disposed on the upper side of the semiconductor substrate 10. The outer peripheral gate runner 130 may be a metal wiring containing aluminum or the like.

The active-side gate runner 131 is provided in the active portion 120. With the provision of the active-side gate runner 131 in the active portion 120, it is possible to reduce a variation in wiring length from the gate pad 112 in each region of the semiconductor substrate 10.

The active-side gate runner 131 is connected to the gate trench portion of the active portion 120. The active-side gate runner 131 is disposed on the upper side of the semiconductor substrate 10. The active-side gate runner 131 may be a wiring formed of a semiconductor such as polysilicon doped with an impurity.

The active-side gate runner 131 may be connected to the outer peripheral gate runner 130. The active-side gate runner 131 of this example is provided to extend in the X axis direction from one outer peripheral gate runner 130 in almost the center of the Y axis direction up to the other outer peripheral gate runner 130 so as to traverse the active portion 120. In a case where the active portion 120 is divided by the active-side gate runner 131, the transistor portion 70 and the diode portion 80 may be alternately disposed in the X axis direction in each divided region.

In addition, the semiconductor device 100 may also be provided with a temperature sense portion (not illustrated) which is a PN junction diode formed of polysilicon or the like, and a current detection portion (not illustrated) which simulates the operation of the transistor portion provided in the active portion 120.

The semiconductor device 100 of this example is provided with an edge terminal structure portion 90 between the outer peripheral gate runner 130 and the edge side 102. The edge terminal structure portion 90 relaxes an electric field concentration on the upper surface side of the semiconductor substrate 10. The edge terminal structure portion 90 is structured by, for example, a guard ring provided in an annular shape surrounding the active portion 120, a field plate, a Resurf, and a combination thereof.

When operating the semiconductor device 100, heat is generated by the current flowing to the semiconductor device 100. Since the heat source surrounds the vicinity of a center position 104 when the semiconductor substrate 10 is viewed from the upper surface, the temperature is more likely to rise than the region in the vicinity of the edge side 102.

The heat generation of the diode portion 80 can be suppressed since heat can be diffused to the transistor portion 70. Therefore, the current density of the diode portion 80 may be able to be set to be higher than the current density of the transistor portion 70. For example, a dummy gate structure is disposed in the transistor portion 70 according to a purpose of increasing the IE effect (electron injection enhancement effect), adjusting a gate capacitance, or the like. Therefore, the current density of the transistor portion 70 tends to be smaller than the current density of the diode portion 80.

Therefore, the heat generation per unit area of the diode portion 80 tends to be larger than the heat generation per unit area of the transistor portion 70.

In the semiconductor device 100, the density of the diode portion 80 in the vicinity of the center position 104 is set to be lower than the density of the diode portion 80 at a position away from the center position 104. With this configuration, it is possible to suppress temperature rise in the vicinity of the center position 104.

In addition, when allowing a current of one-half or more of the rated current to continuously flow to the diode portion 80 to increase a self-heating temperature, a forward voltage of the diode portion 80 may be lowered. For example, crystal defects may be formed in the diode portion 80 in order to shorten a carrier life time in the diode portion 80. By shortening the carrier life time in the diode portion 80, a reverse recovery time of the diode portion 80 can be shortened to lower a reverse recovery loss.

When the temperature of the diode portion 80 rises due to the continuous flowing of current as described above, the crystal defects in the diode portion 80 may be recovered. When the crystal defects are recovered and the density of the crystal defects is changed, a resistance value of the semiconductor substrate 10 in the diode portion 80 is changed, and as the forward voltage of the diode portion 80 is lowered, the reverse recovery loss is increased.

In the semiconductor device 100, the density of the diode portion 80 in the vicinity of the center position 104 is set to be lower than the density of the diode portion 80 at a position away from the center position 104. With this configuration, it is possible to suppress a characteristic change of the diode portion 80 due to the temperature rise in the vicinity of the center position 104.

In this example, among a plurality of the transistor portions 70 discretely disposed in the X axis direction, two or more transistor portions 70 sequentially selected from the portions nearer to the center position 104 of the semiconductor substrate 10 in the X axis direction are referred to as first transistor portions 70-1. In the example of FIG. 1, three transistor portions 70 near the center position 104 in the X axis direction are denoted as the first transistor portion 70-1. The transistor portions 70 other than the first transistor portion 70-1 are denoted as a second transistor portion 70-2. The second transistor portions 70-2 are disposed on the outer side in the X axis direction than the first transistor portion 70-1. The outer side indicates a side far from the center position 104.

The second transistor portions 70-2 are desirably disposed by two or more in the X axis direction between the center position 104 and one edge side 102. In other words, two or more second transistor portions 70-2 are desirably disposed on both sides of two or more first transistor portions 70-1. In the example of FIG. 1, three second transistor portions 70-2 are disposed on both sides of three first transistor portions 70-1.

The first transistor portions 70-1 may be continuously disposed by three or more in the X axis direction. The continuous arrangement of the first transistor portions 70-1 means that the first transistor portion 70-1 and the diode portion 80 are alternately disposed without including the second transistor portion 70-2. The second transistor portions 70-2 may be continuously disposed by three or more in the X axis direction. The continuous arrangement of the second transistor portion 70-2 means that the second transistor portion 70-2 and the diode portion 80 are alternately disposed without including the first transistor portion 70-1.

A first width W1 in the X axis direction of the first transistor portion 70-1 is larger than a second width W2 in the X axis direction of any of the second transistor portions 70-2. In this example, the first widths W1 of the first transistor portions 70-1 are the same. In addition, the second widths W2 of the second transistor portions 70-2 are the same. In other words, in the vicinity of the center position 104, the transistor portion 70 having a large width is disposed compared to the other regions.

In the X axis direction, the diode portion 80 is disposed between the transistor portions 70. Widths Wf of the diode portions 80 may be the same or may be different. The width Wf of the diode portion 80 may be small, same, or large with respect to the second width W2.

In this example, the first transistor portion 70-1 having a large width is disposed in the vicinity of the center position 104, and the second transistor portion 70-2 having a small width is disposed at a position away from the center position 104. Therefore, the density of the diode portion 80 in the vicinity of the center position 104 is reduced compared to the position away from the center position 104. Therefore, it is possible to suppress the temperature rise in the vicinity of the center position 104. In addition, the temperature difference between the transistor portion 70 and the diode portion 80 is smaller in the outer peripheral portion between the center position 104 and the outer peripheral portion. Therefore, the temperature of the entire chip can be reduced, the heat collected near the center is hardly increased, and the decrease in the forward voltage of the diode portion 80 can be suppressed.

In addition, the temperature distribution in the X axis direction can be made gentle by disposing two or more first transistor portions 70-1 in the X axis direction. For example, if transistor portions 70 having different widths are alternately disposed one by one, a heat source having a large area and a heat source having a small area are disposed in a short period, so that peaks and valleys occur in a short period in the temperature distribution in the X axis direction. On the other hand, if two or more transistor portions 70 having the same width are continuously disposed, the number of peaks and valleys in the temperature distribution in the X axis direction can be reduced.

Further, it is desirable that the first transistor portions 70-1 be disposed at the center position 104 in the X axis direction of the semiconductor substrate 10. With this configuration, it is possible to prevent the diode portion 80 from being disposed at the center position 104 in the X axis direction, and suppress a characteristic change of the diode portion 80.

A value W2/W1 obtained by dividing the second width W2 by the first width W1 may be larger than 0.5. With this configuration, the density of the diode portion 80 in the vicinity of the center position 104 can be reduced. W2/W1 may be larger than 0.6, or may be larger than 0.7.

W2/W1 may be smaller than 1. With this configuration, it is possible to limit a change in characteristics such as a channel density and a temperature distribution from being too large at the boundary between the region where the first transistor portion 70-1 is provided and the region where the second transistor portion 70-2 is provided. W2/W1 may be smaller than 0.9, or may be smaller than 0.8.

The first width W1 may be larger than 700 μm. With this configuration, the density of the diode portion 80 in the vicinity of the center position 104 can be reduced. The first width W1 may be larger than 800 μm, or may be larger than 900 μm.

The first width W1 may be smaller than 1100 μm. With this configuration, it is possible to limit that the first transistor portion 70-1 becomes too large and a change in characteristics such as a channel density and a temperature distribution becomes too large at the boundary with the region where the second transistor portion 70-2 is provided. The first width W1 may be smaller than 1000 μm, or may be smaller than 900 μm.

The first width W1 may be larger than the width in the X axis direction of the gate pad 112. The first width W1 may be larger than the width Wf of the diode portion 80. In addition, a shortest distance between the center position 104 and the diode portion 80 in the X axis direction may be equal to or more than 10% of the width of the semiconductor substrate 10 in the X axis direction. The shortest distance may be equal to or more than 15% of the width of the semiconductor substrate 10, or may be equal to or more than 20%.

The second width W2 may be larger than 200 μm. The second width W2 may be larger than 300 μm, or may be larger than 400 μm. The second width W2 may be smaller than 700 μm. The second width W2 may be smaller than 600 μm, or may be smaller than 500 μm.

The width Wf of the diode portion 80 may be larger than 200 μm. A total area of the diode portion 80 in the upper surface of the semiconductor substrate 10 is determined according to a performance required for the semiconductor device 100. When the width Wf of the diode portion 80 is set to large, an area for one diode portion 80 becomes large, so that the number of diode portions 80 becomes small. When the number of diode portions 80 is large, the area of the boundary between the diode portion 80 and the transistor portion 70 is increased. The peak current at the time of reverse recovery of the diode portion 80 becomes larger due to the carrier flowing from the transistor portion 70 to the diode portion 80. Therefore, the reverse recovery loss tends to be large. As the number of diode portions 80 becomes small, the boundary portion with the transistor portion 70 can be made small. However, the temperature difference between the transistor portion 70 and the diode portion 80 becomes large, and heat generation of the chip becomes large. The number of diode portions 80 has a trade-off relationship with diode loss or chip heat quantity.

The width Wf of the diode portion 80 may be larger than 400 µm, or may be larger than 500 µm. The width Wf of the diode portion 80 may be 2.5 times or more than the thickness in the Z axis direction of the semiconductor substrate 10, may be 3.5 times or more, or may be 4.5 times or more.

Figure 2:
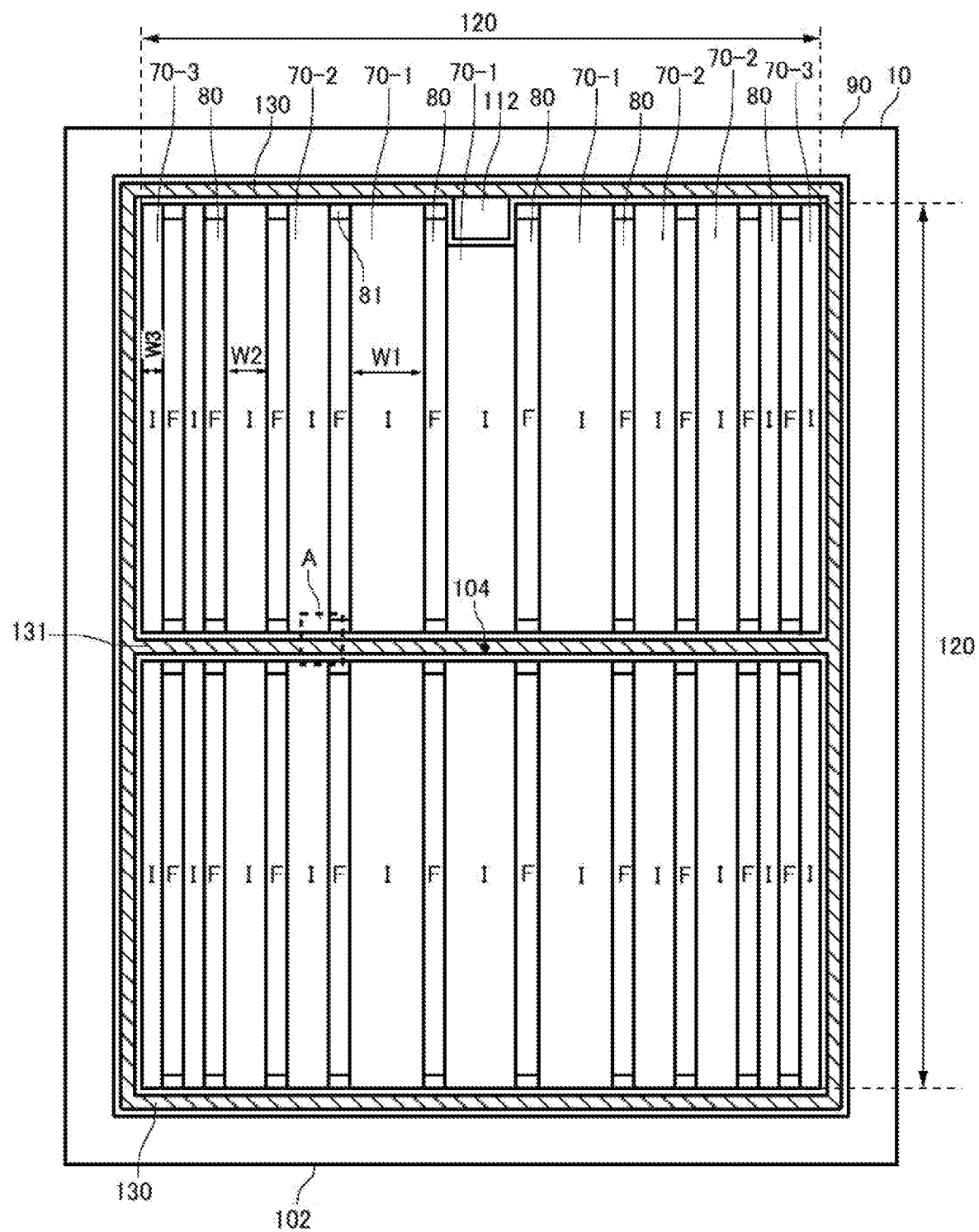
FIG. 2 is a top view illustrating another structure example of the semiconductor device 100.

FIG. 2 is a top view illustrating another structure example of the semiconductor device 100. In this example again, the widths of two or more transistor portions 70 sequentially selected from those nearer to the center position 104 are larger than the width in the arrangement direction of the other transistor portions 70. In the semiconductor device 100 of this example, the transistor portion 70 includes one or more first transistor portions 70-1, one or more second transistor portions 70-2, and one or more third transistor portions 70-3.

The first transistor portion 70-1 is disposed nearest to the center position 104. The first width W1 of the first transistor portion 70-1 may be the same as the first width W1 of the first transistor portion 70-1 described in FIG. 1.

The second transistor portions 70-2 are disposed further away from the center position 104 than the first transistor portion 70-1 in the X axis direction. The third transistor portions 70-3 are disposed further away from the center position 104 than the second transistor portion 70-2 in the X axis direction.

The first width W1 in the X axis direction of the first transistor portion 70-1 is larger than the second width W2 in the X axis direction of the second transistor portion 70-2. In addition, the second width W2 of the second transistor portion is larger than a third width W3 in the X axis direction of the third transistor portion 70-3. In other words, in the semiconductor device 100 of this example, the width of the transistor portion 70 decreases stepwise as the distance away from the center position 104 increases. One of the second transistor portion 70-2 and the third transistor portion 70-3 of this example may have the same width as the second transistor portion 70-2 illustrated in FIG. 1.

In the semiconductor device 100 of this example, the width of the transistor portion 70 is reduced as the distance away from the center position 104 is increased. In the example of FIG. 2, the width of the transistor portion 70 has three types of W1, W2, and W3. However, the width of the transistor portion 70 may have four or more types in other examples. In addition, two or more transistor portions 70 having the same width may also be continuously disposed in the X axis direction. In this example again, the density of the diode portion 80 in the vicinity of the center position 104 can be made lower than the density of the diode portion 80 at a position away from the center position 104. With this configuration, it is possible to suppress the temperature rise in the vicinity of the center position 104, and suppress the characteristic change of the diode portion 80.

Figure 3:
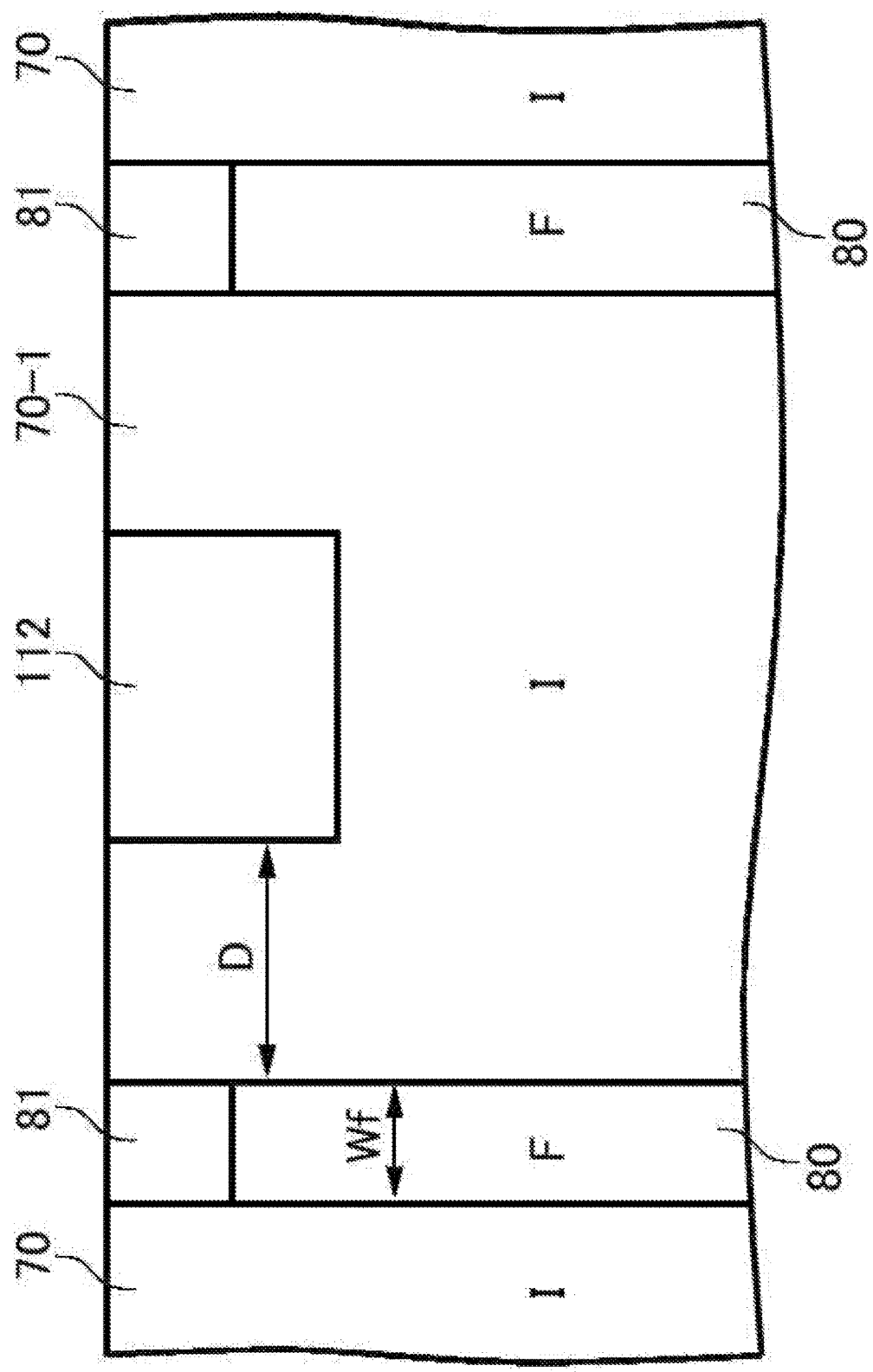
FIG. 3 is a diagram illustrating an arrangement example of a diode portion 80 and a transistor portion 70 in the vicinity of a gate pad 112 electrically connected to the transistor portion 70.

FIG. 3 is a diagram illustrating an arrangement example of the diode portion 80 and the transistor portion 70 in the vicinity of the gate pad 112 which is electrically connected to the transistor portion 70. The arrangement of this example may be applied to any of FIGS. 1 and 2.

The gate pad 112 of this example is disposed at a position to face the first transistor portion 70-1 having the first width W1 in the Y axis direction. The gate pad 112 may also be disposed on the upper side of the first transistor portion 70-1.

In this example, a distance in the X axis direction between the diode portion 80 nearest to the gate pad 112 in the X axis direction and the gate pad 112 is referred to as D. In the upper surface of the semiconductor substrate 10 on the lower side of the gate pad 112, a P+ type well region is provided. The well region has a doping concentration higher than a drift region described later, and is provided up to a position deeper than a base region described later.

An N+ type cathode region is provided in the lower surface of the diode portion 80. Therefore, if the distance D between the gate pad 112 and the diode portion 80 becomes small, the distance between the well region and the cathode region with a high concentration becomes close, and the reverse recovery withstand capability is lowered. The distance D of this example is larger than the width Wf of the diode portion 80. With this configuration, it is possible to suppress the reverse recovery withstand capability from being lowered. The distance D may be 0.25 times or more than the width Wf, or may be 1 times or more.

Figure 4:
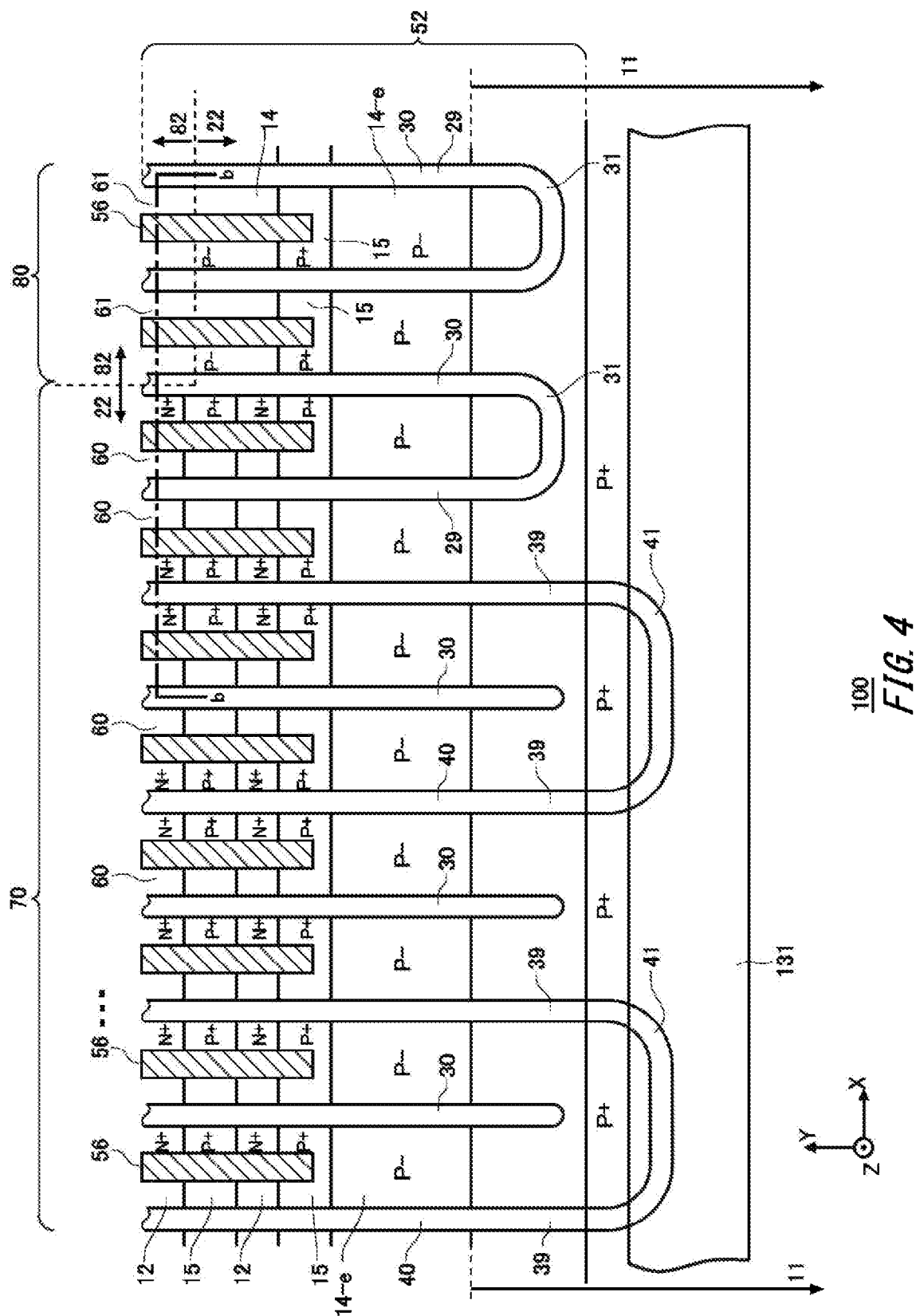
FIG. 4 is an enlarged view of Region A in FIGS. 1 and 2.

FIG. 4 is an enlarged view of Region A in FIGS. 1 and 2. Region A is a region where the transistor portion 70, the diode portion 80, and the active-side gate runner 131 are included. The semiconductor device 100 of this example is provided with a gate trench portion 40, a dummy trench portion 30, a well region 11, an emitter region 12, a base region 14, and a contact region 15 which are provided inside the upper surface side of the semiconductor substrate 10. The gate trench portion 40 and the dummy trench portion 30 each are an example of the trench portion. In addition, the semiconductor device 100 of this example is provided with an emitter electrode 52 and the active-side gate runner 131 which are provided on the upper side of the upper surface of the semiconductor substrate 10. The emitter electrode 52 and the active-side gate runner 131 are provided to be separated from each other.

An interlayer dielectric film is provided between the upper surface of the semiconductor substrate 10, and the emitter electrode 52 and the active-side gate runner 131, but is omitted in FIG. 4. In the interlayer dielectric film of this example, a contact hole 56 is provided to pass through the interlayer insulating film. In FIG. 4, each contact hole 56 is hatched with inclined lines.

The emitter electrode 52 is provided on the upper side of the gate trench portion 40, the dummy trench portion 30, the well region 11, the emitter region 12, the base region 14, and the contact region 15. The emitter electrode 52 is in contact with the emitter region 12, the contact region 15, and the base region 14 in the upper surface of the semiconductor substrate 10 through the contact hole 56. In addition, the emitter electrode 52 is connected to a dummy conductive portion in the dummy trench portion 30 through the contact hole provided in the interlayer insulating film. The emitter electrode 52 may be connected to the dummy conductive portion of the dummy trench portion 30 at the edge of the dummy trench portion 30 in the Y axis direction.

The active-side gate runner 131 is connected to the gate trench portion 40 through the contact hole provided in the interlayer insulating film. The active-side gate runner 131 may be connected to a gate conductive portion of the gate trench portion 40 in an edge 41 of the gate trench portion 40 in the Y axis direction. The active-side gate runner 131 is not connected to the dummy conductive portion in the dummy trench portion 30.

The emitter electrode 52 is formed of a material containing metal. FIG. 4 illustrates a range where the emitter electrode 52 is provided. For example, at least a part of the region of the emitter electrode 52 is formed of aluminum or an aluminum-silicon alloy. The emitter electrode 52 may have a barrier metal formed of titan, a titan compound or the like in the lower layer of the region formed of aluminum or the like. Further, in the contact hole, a plug formed with tungsten or the like buried therein may also be included to be in contact with the barrier metal, aluminum and the like.

The well region 11 is provided to be overlapped with the active-side gate runner 131. The well region 11 is also provided to extend with a predetermined width in a range where the active-side gate runner 131 is not overlapped. The well region 11 of this example is provided to be separated from the end in the Y axis direction of the contact hole 56 toward the active-side gate runner 131. The well region 11 is a second conductivity type region in which the doping concentration is higher than the base region 14. The base region 14 of this example is a P− type, and the well region 11 is a P+ type.

Each of the transistor portion 70 and the diode portion 80 includes a plurality of trench portions arranged in the arrangement direction. In the transistor portion 70 of this example, one or more gate trench portions 40 and one or more dummy trench portions 30 are alternately provided along the arrangement direction. In the diode portion 80 of this example, the plurality of dummy trench portions 30 are provided along the arrangement direction. In the diode portion 80 of this example, the gate trench portion 40 is not provided.

The gate trench portion 40 of this example may include two linear portions 39 (portions of the trench that are linear along the extension direction) extending along the extension direction perpendicular to the arrangement direction, and the edge 41 for connecting two linear portions 39. The extension direction in FIG. 4 is the Y axis direction.

At least a part of the edge 41 is desirably provided in a curved shape when viewed from the upper surface. The edge 41 connects the ends in the Y axis direction of two linear portions 39, so that the electric field concentration in the end portion of the linear portion 39 can be relaxed.

In the transistor portion 70, the dummy trench portion 30 is provided between the linear portions 39 of the gate trench portion 40. One dummy trench portion 30 may be provided, or a plurality of dummy trench portions 30 may be provided, between the linear portions 39. The dummy trench portion 30 may be in a linear shape extending in the extension direction, or may include the linear portion 29 and an edge 31 similarly to the gate trench portion 40. The semiconductor device 100 illustrated in FIG. 4 includes both the linear dummy trench portion 30 having no edge 31 and the dummy trench portion 30 having the edge 31.

A diffusion depth of the well region 11 may be deeper than the depth of the gate trench portion 40 and the dummy trench portion 30. The end portions in the Y axis direction of the gate trench portion 40 and the dummy trench portion 30 are provided in the well region 11 when viewed from the upper surface. In other words, the bottom in the depth direction of each trench portion is covered with the well region 11 at the end portion in the Y axis direction of each trench portion. With this configuration, the electric field concentration on the bottom of each trench portion can be relaxed.

A mesa portion is provided between the trench portions in the arrangement direction. The mesa portion indicates a region interposed between the trench portions inside the semiconductor substrate 10. As an example, the upper end of the mesa portion is the upper surface of the semiconductor substrate 10. The depth position of the lower end of the mesa portion is the same as the depth position of the lower end of the trench portion. The mesa portion of this example is provided to extend in the extension direction (Y axis direction) along the trench in the upper surface of the semiconductor substrate 10. In this example, a mesa portion 60 is provided in the transistor portion 70, and a mesa portion 61 is provided in the diode portion 80. In the case of simply mentioning "mesa portion" in the present specification, the portion indicates each of the mesa portion 60 and the mesa portion 61.

Each mesa portion is provided with the base region 14. In the base region 14 exposed to the upper surface of the semiconductor substrate 10 in the mesa portion, a region disposed nearest to the active-side gate runner 131 is referred to as a base region 14-e. In FIG. 4, the base region 14-e disposed in one end portion in the extension direction of each mesa portion is illustrated. However, the base region 14-e is also disposed in the other end portion of each mesa portion. In each mesa portion, at least one of the first conductivity type emitter region 12 and the second conductivity type contact region 15 may be provided in the region interposed between the base regions 14-e when viewed from the upper surface. The emitter region 12 of this example is an N+ type, and the contact region 15 is a P+ type. The emitter region 12 and the contact region 15 may be provided between the base region 14 and the upper surface of the semiconductor substrate 10 in the depth direction.

The mesa portion 60 of the transistor portion 70 includes the emitter region 12 exposed to the upper surface of the semiconductor substrate 10. The emitter region 12 is provided in contact with the gate trench portion 40. The mesa portion 60 in contact with the gate trench portion 40 may be provided with the contact region 15 exposed to the upper surface of the semiconductor substrate 10.

Each of the contact region 15 and the emitter region 12 in the mesa portion 60 is provided from one trench portion in the X axis direction to the other trench portion. As an example, the contact region 15 and the emitter region 12 of the mesa portion 60 are alternately disposed along the extension direction (Y axis direction) of the trench portion.

In another example, the contact region 15 and the emitter region 12 of the mesa portion 60 may also be provided in a stripe shape along the extension direction (Y axis direction) of the trench portion. For example, the emitter region 12 is provided in a region in contact with the trench portion, and the contact region 15 is provided in a region interposed between the emitter regions 12.

In the mesa portion 61 of the diode portion 80, the emitter region 12 is not provided. In the upper surface of the mesa portion 61, the base region 14 and the contact region 15 may be provided. In the region interposed between the base regions 14-e in the upper surface of the mesa portion 61, the contact region 15 may be provided in contact with each base region 14-e. In the region interposed between the contact region 15 in the upper surface of the mesa portion 61, the base region 14 may be provided. The base region 14 may be disposed in the entire region interposed between the contact regions 15.

On the upper side of each mesa portion, the contact hole 56 is provided. The contact hole 56 is disposed in the region interposed between the base regions 14-e. The contact hole 56 of this example is provided on the upper side of each of the contact region 15, the base region 14, and the emitter region 12. The contact hole 56 is not provided in the region corresponding to the base region 14-e and the well region 11. The contact hole 56 may be disposed at the center in the arrangement direction (X axis direction) of the mesa portion 60.

In the diode portion 80, an N+ type cathode region 82 is provided in a region adjacent to the lower surface of the semiconductor substrate 10. In the lower surface of the semiconductor substrate 10, a P+ type collector region 22 may be provided in the region where the cathode region 82 is not provided. In FIG. 4, the boundary between the cathode region 82 and the collector region 22 is illustrated with a dotted line.

Figure 5:
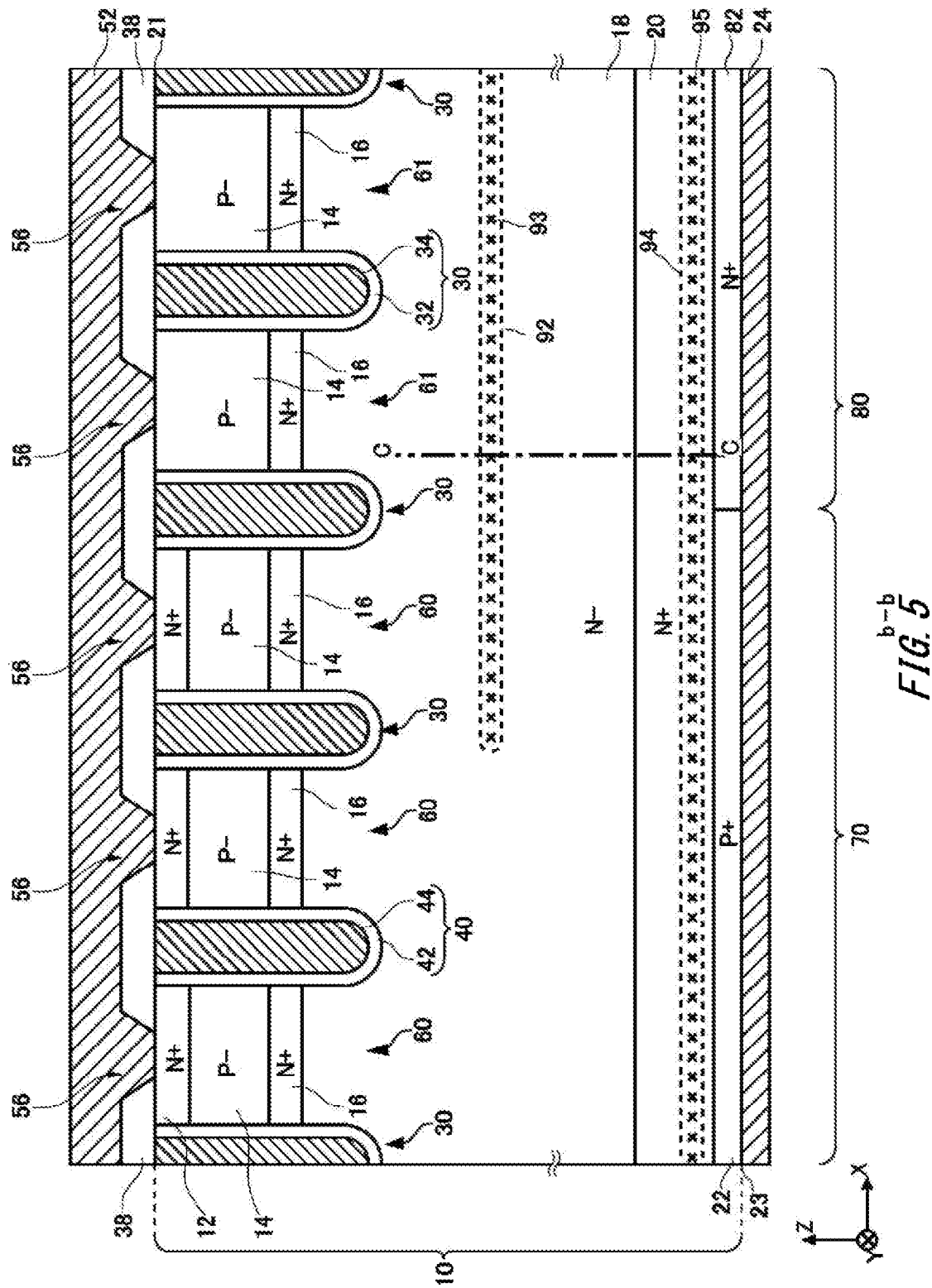
FIG. 5 is a diagram illustrating an example of a cross section taken along a line b-b in FIG. 4.

FIG. 5 is a diagram illustrating an example of a cross section taken along a line b-b in FIG. 4. The b-b cross section is an XZ plane passing through the emitter region 12 and the cathode region 82. The semiconductor device 100 of this example includes the semiconductor substrate 10, an interlayer dielectric film 38, the emitter electrode 52, and a collector electrode 24 in the corresponding cross section. The interlayer dielectric film 38 is provided in the upper surface of the semiconductor substrate 10. The interlayer dielectric film 38 is a film including at least one of an insulating film such as silicate glass to which an impurity such as boron or phosphorus is added, a thermal oxide film, and another insulating film. In the interlayer dielectric film 38, the contact hole 56 described in FIG. 2 is provided.

The emitter electrode 52 is provided on the upper side of the interlayer dielectric film 38. The emitter electrode 52 is in contact with an upper surface 21 of the semiconductor substrate 10 through the contact hole 56 of the interlayer dielectric film 38. The collector electrode 24 is provided in a lower surface 23 of the semiconductor substrate 10. The emitter electrode 52 and the collector electrode 24 are formed of a metal material such as aluminum or the like. In the present specification, a direction (Z axis direction) connecting the emitter electrode 52 and the collector electrode 24 is referred to as a depth direction.

The semiconductor substrate 10 includes an N− type drift region 18. The drift region 18 is provided in each of the transistor portion 70 and the diode portion 80.

In the mesa portion 60 of the transistor portion 70, the N+ type emitter region 12 and the P− type base region 14 are sequentially provided from the upper surface 21 side of the semiconductor substrate 10. The drift region 18 is provided on the lower side of the base region 14. In the mesa portion 60, an N+ type accumulation region 16 may also be provided. The accumulation region 16 is disposed between the base region 14 and the drift region 18.

The emitter region 12 is exposed to the upper surface 21 of the semiconductor substrate 10, and is provided in contact with the gate trench portion 40. The emitter region 12 may be in contact with the trench portions on both sides of the mesa portion 60. The emitter region 12 has a doping concentration higher than the drift region 18.

The base region 14 is provided on the lower side of the emitter region 12. The base region 14 of this example is provided in contact with the emitter region 12. The base region 14 may be in contact with the trench portions on both sides of the mesa portion 60.

The accumulation region 16 is provided on the lower side of the base region 14. The accumulation region 16 has a doping concentration higher than the drift region 18. By providing a highly-concentrated accumulation region 16 between the drift region 18 and the base region 14, it is possible to increase a carrier injection enhancement effect (IE effect) to lower the ON voltage. The accumulation region 16 may be provided to cover the entire lower surface of the base region 14 in each mesa portion 60.

In the mesa portion 61 of the diode portion 80, a P− type base region 14 is provided in contact with the upper surface 21 of the semiconductor substrate 10. On the lower side of the base region 14, the drift region 18 is provided. In the mesa portion 61, the accumulation region 16 may also be provided on the lower side of the base region 14.

In each of the transistor portion 70 and the diode portion 80, an N+ type buffer region 20 may be provided below the drift region 18. The doping concentration of the buffer region 20 has a doping concentration higher than the drift region 18. The buffer region 20 may function as a field stopper layer which prevents a depletion layer expanding from the lower end of the base region 14 from reaching the P+ type collector region 22 and the N+ type cathode region 82. The buffer region 20 may have a plurality of peaks in a doping concentration distribution in the depth direction, or may have a single peak.

In the transistor portion 70, the P+ type collector region 22 is provided below the buffer region 20. In the diode portion 80, the N+ type cathode region 82 is provided below the buffer region 20. The collector region 22 and the cathode region 82 are exposed to the lower surface 23 of the semiconductor substrate 10, and connected to the collector electrode 24.

On a side near the upper surface 21 of the semiconductor substrate 10, one or more gate trench portions 40 and one or more dummy trench portions 30 are provided. Each trench portion passes through the base region 14 from the upper surface 21 of the semiconductor substrate 10, and reaches the drift region 18. In the region where at least one of the emitter region 12, the contact region 15, and the accumulation region 16 is provided, each trench portion passes through these doping regions and reaches the drift region 18. The configuration that the trench portion passes through the doping region is not limited to the one manufactured in the order of forming the doping region and then forming the trench portion. The configuration that the doping region is formed between the trench portions after forming the trench portion includes a configuration that the trench portion passes through the doping region.

As described above, the gate trench portion 40 and the dummy trench portion 30 are provided in the transistor portion 70. In the diode portion 80, the dummy trench portion 30 is provided, and the gate trench portion 40 is not provided. The boundary in the X axis direction between the diode portion 80 and the transistor portion 70 in this example is the boundary between the cathode region 82 and the collector region 22.

The gate trench portion 40 includes a gate trench provided in the upper surface 21 of the semiconductor substrate 10, a gate insulating film 42, and a gate conductive portion 44. The gate insulating film 42 is provided to cover the inner wall of the gate trench. The gate insulating film 42 may be formed by oxidizing or nitriding a semiconductor on the inner wall of the gate trench. The gate conductive portion 44 is provided inside from the gate insulating film 42 in the gate trench. In other words, the gate insulating film 42 insulates the gate conductive portion 44 from the semiconductor substrate 10. The gate conductive portion 44 is formed of a conductive material such as polysilicon or the like.

The gate conductive portion 44 may be provided longer than the base region 14 in the depth direction. The gate trench portion 40 in the corresponding cross section is covered by the interlayer dielectric film 38 in the upper surface 21 of the semiconductor substrate 10. The gate conductive portion 44 is electrically connected to the gate runner. When a predetermined gate voltage is applied to the gate conductive portion 44, a channel is formed by an electron inversion layer in a surface layer of the base region 14 at a boundary in contact with the gate trench portion 40.

The dummy trench portion 30 may have the same structure as the gate trench portion 40 in the corresponding cross section. The dummy trench portion 30 includes a dummy trench provided in the upper surface 21 of the semiconductor substrate 10, a dummy insulating film 32, and a dummy conductive portion 34. The dummy conductive portion 34 is electrically connected to the emitter electrode 52. The dummy insulating film 32 is provided to cover the inner wall of the dummy trench. The dummy conductive portion 34 is provided in the gate trench, and is provided inside the dummy insulating film 32. The dummy insulating film 32 insulates the dummy conductive portion 34 from the semiconductor substrate 10. The dummy conductive portion 34 may be formed of the same material as the gate conductive portion 44. For example, the dummy conductive portion 34 is formed of a conductive material such as polysilicon or the like. The dummy conductive portion 34 may have the same length as the gate conductive portion 44 in the depth direction.

The gate trench portion 40 and the dummy trench portion 30 of this example are covered by the interlayer dielectric film 38 in the upper surface 21 of the semiconductor substrate 10. Further, the bottoms of the dummy trench portion 30 and the gate trench portion 40 may be formed in a curved-surface shape (a curved-line shape in the cross section) convexly downward.

The diode portion 80 includes an upper-surface-side lifetime control region 92. The lifetime control region is a region in which the carrier life time distribution in the depth direction of the semiconductor substrate 10 has a valley.

The upper-surface-side lifetime control region 92 is provided on the upper surface 21 side of the semiconductor substrate 10. The upper surface 21 side indicates a region between the center in the depth direction of the semiconductor substrate 10 and the upper surface 21. For example, the upper-surface-side lifetime control region 92 can be formed by implanting an impurity such as helium and proton in a predetermined range from the upper surface 21 side of the semiconductor substrate 10. The crystal defects are formed by implanting the impurity, and the carrier life time becomes short by combining the crystal defects and the carriers. In the upper-surface-side lifetime control region 92, a defect density peak 93 of a crystal defect density distribution in the depth direction may be provided. In FIG. 5, the defect density peak 93 is schematically illustrated with x. At the position of the defect density peak 93, the carrier life time distribution may be a local minimum.

The upper-surface-side lifetime control region 92 may be provided in the entire diode portion 80 in the X axis direction. In addition, the upper-surface-side lifetime control region 92 may be provided even in the region in contact with the diode portion 80 in the transistor portion 70. In other words, the upper-surface-side lifetime control region 92 may be continuously provided in the X axis direction from the diode portion 80 to a part of the transistor portion 70.

The diode portion 80 and the transistor portion 70 may include a lower-surface-side lifetime control region 94. The lower-surface-side lifetime control region 94 may be provided in the entirety of the transistor portion 70 and the diode portion 80 in the X axis direction. The lower-surface-side lifetime control region 94 is provided on the lower surface 23 side of the semiconductor substrate 10. The lower surface 23 side indicates a region between the center in the depth direction of the semiconductor substrate 10 and the lower surface 23. For example, the lower-surface-side lifetime control region 94 can be formed by implanting an impurity such as helium or the like in a predetermined range from the lower surface 23 side of the semiconductor substrate 10. In the lower-surface-side lifetime control region 94, a defect density peak 95 of the crystal defect density distribution in the depth direction may be provided. At the position of the defect density peak 95, the carrier life time distribution may be a local minimum.

Figure 6:
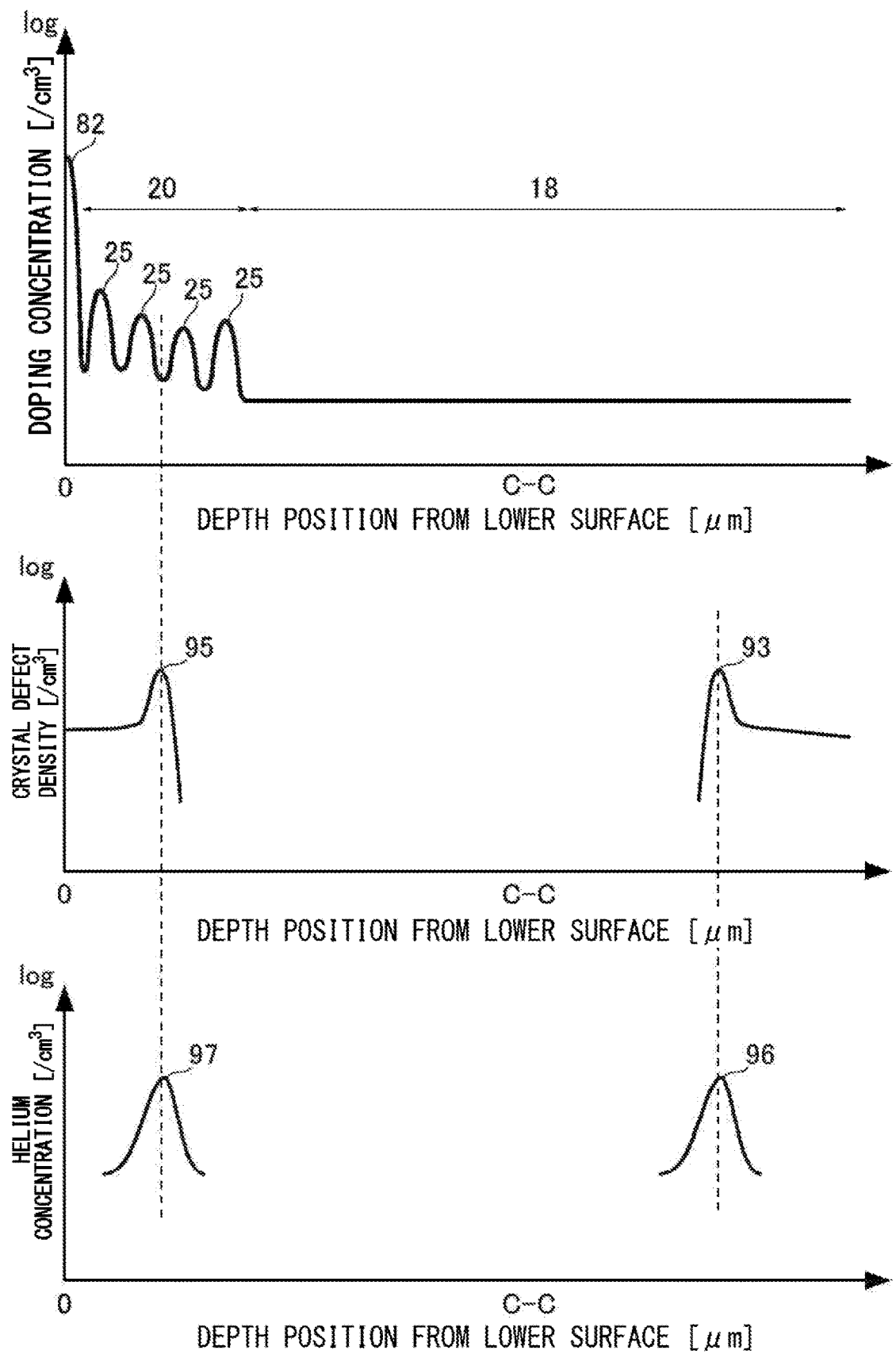
FIG. 6 is a diagram illustrating examples of a doping concentration distribution, a crystal defect density distribution, and a helium concentration distribution on a line C-C of FIG. 5.

FIG. 6 is a diagram illustrating examples of the doping concentration distribution, the crystal defect density distribution, and a helium concentration distribution on a line C-C of FIG. 5. The line C-C is a line passing from the upper side of the upper-surface-side lifetime control region 92 in the diode portion 80 to the lower side of the lower-surface-side lifetime control region 94.

The doping concentration distribution of this example includes one or more concentration peaks 25 in the buffer region 20. The plurality of concentration peaks 25 may be provided in the depth direction. The doping concentration in the buffer region 20 is higher than the doping concentration in the drift region 18.

Each of the concentration peaks 25 can be formed by implanting hydrogen ions such as proton. By implanting hydrogen ions into the semiconductor substrate 10 and annealing, hydrogen itself becomes a donor, or the crystal defect such as a void in the semiconductor substrate 10 is terminated by hydrogen or oxygen to become a donor. The buffer region 20 may include a hydrogen concentration peak corresponding to each of the concentration peaks 25. The positions of the concentration peak 25 and the hydrogen concentration peak may be the same.

The crystal defect density distribution in the diode portion 80 includes one or more defect density peaks. In the example of FIG. 6, the crystal defect density distribution includes the defect density peak 93 and the defect density peak 95. The crystal defects is formed in a region where the impurity such as helium passes through. Therefore, each of the defect density peaks includes a smooth slope on a side where the impurity is implanted, and a steep slope on a side where the impurity is not implanted. In addition, the density in the defect density peak can be controlled by a dose amount or the like of the impurity such as helium.

The defect density peak 95 is provided in the buffer region 20. The defect density peak 95 may be disposed between the concentration peaks 25 in the buffer region 20. The configuration that a predetermined peak is disposed between two other peaks in the present specification indicates that the apex of a predetermined peak is disposed between the apexes of two other peaks, and the apex of a predetermined peak is not included to the half-value width of each of two other peaks.

In addition, the helium concentration distribution includes one or more concentration peaks. In the example of FIG. 6, there are included the concentration peak 96 corresponding to the defect density peak 93, and a concentration peak 97 corresponding to the defect density peak 95. The corresponding density peak and the concentration peak may be provided at the same depth position.

With such a configuration, it is possible to provide the defect density peak of a predetermined density at a predetermined depth position, and the carrier life time can be adjusted. However, as described above, when the temperature rises during the operation of the semiconductor device 100, the crystal defects of voids (V) due to the helium irradiation and hydrogen (H) and oxygen (O) in the semiconductor substrate 10 are combined to increase VOH defects, and the density of crystal defects of voids due to helium irradiation may be lowered. In particular, in this example, a large amount of hydrogen exists in the buffer region 20. Therefore, the density of the crystal defects of voids due to helium irradiation, which is provided in the buffer region 20 tends to be lowered.

On the other hand, in the semiconductor device 100, the diode portion 80 is less in the vicinity of the center position 104 of the semiconductor substrate 10 where the temperature tends to rise. Therefore, it is possible to suppress the decrease in density of the crystal defects of voids due to helium irradiation in the diode portion 80.

The crystal defects of voids due to helium irradiation tend to form the VOH defects together with hydrogen when the oxygen concentration in the semiconductor substrate 10 is high. Therefore, in a case where the oxygen concentration in the semiconductor substrate 10 is high, the density of the crystal defects of voids due to helium irradiation of the diode portion 80 by the semiconductor device 100 is apparently lowered. The oxygen concentration of the semiconductor substrate 10 may be $1.0 \times 10^{17}/cm^3$ or more. The oxygen concentration of the semiconductor substrate 10 may be $2.0 \times 10^{17}/cm^3$ or more, or may be $5.0 \times 10^{17}/cm^3$ or more. The oxygen concentration of the semiconductor substrate 10 may be an average value, or may be a maximum value. In addition, the semiconductor substrate 10 may be an MCZ substrate. The MCZ substrate is a substrate formed by an MCZ (Magnetic field applied CZochralski) method. The MCZ substrate has a relatively high oxygen concentration. Further, it is possible to further suppress that the crystal defects are terminated by hydrogen by disposing the defect density peak 95 between the concentration peaks 25.

In this example, the defect density peak 95 has been disposed between the concentration peaks 25. However, the defect density peak 95 may also be disposed at a position where the distance from the lower surface 23 is longer than the concentration peak 25 at a position where the distance from the lower surface 23 is the longest among the plurality of concentration peaks 25. In addition, the concentration peak 25 may also be formed by implanting phosphorus ions. Further, in a case where the concentration peak 25 is one, the defect density peak 95 may also be disposed at a position where the distance from the lower surface is longer than the concentration peak 25. In addition, in a case where the concentration peak 25 is one, the defect density peak 95 may also be disposed between the concentration peak 25 and the concentration peak of the cathode region 82.

Figure 7:
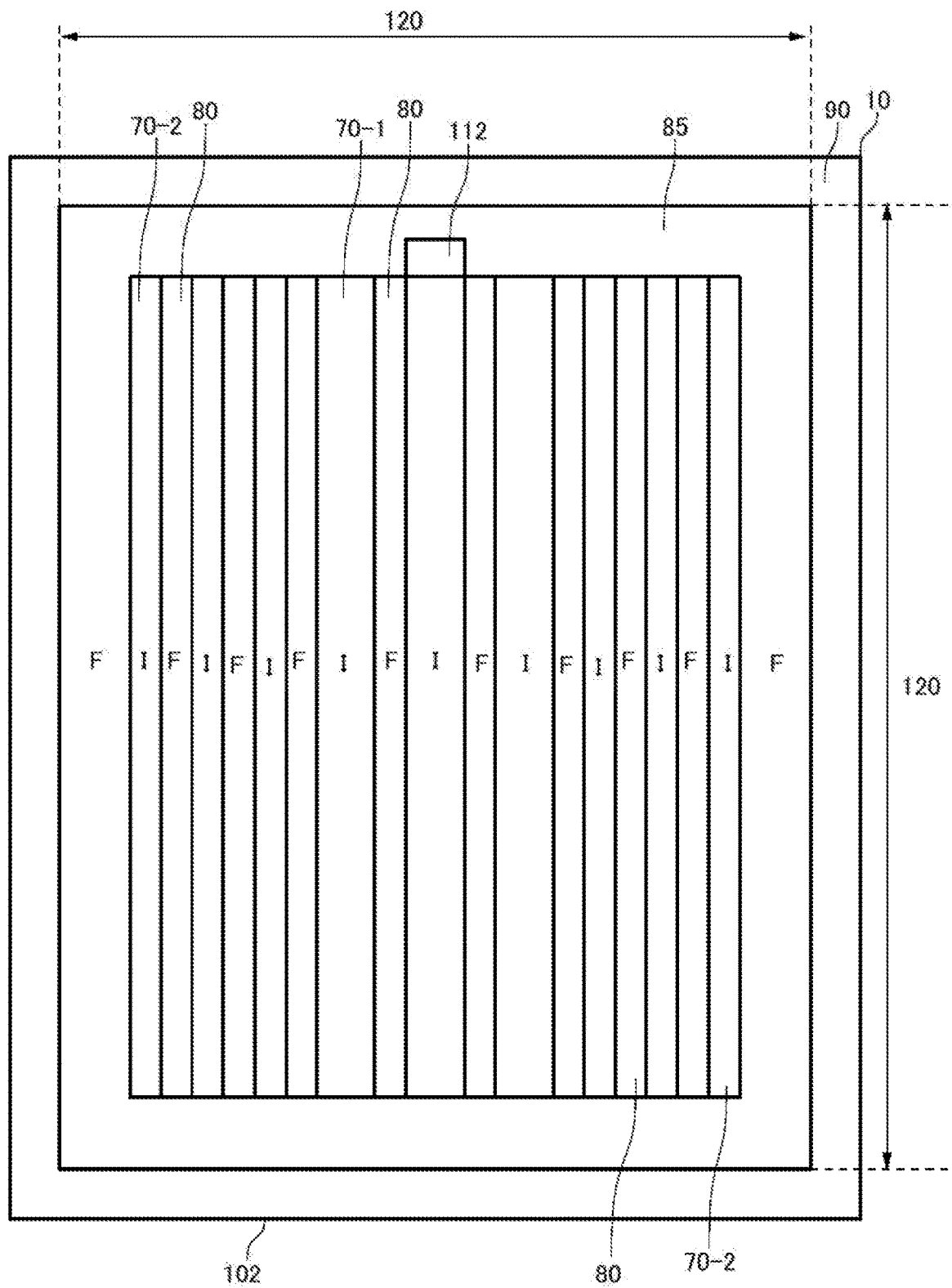
FIG. 7 is a top view illustrating another structure example of the semiconductor device 100.

FIG. 7 is a top view illustrating another structure example of the semiconductor device 100. Further, the semiconductor device 100 of this example is provided with an outer peripheral diode portion 85 in addition to the example described in FIGS. 1 to 6. The outer peripheral diode portion 85 surrounds a region where the transistor portion 70 and the diode portion 80 are alternately disposed along the X axis direction in the upper surface of the semiconductor substrate 10. The arrangement of the transistor portion 70 and the diode portion 80 in the region surrounded by the outer peripheral diode portion 85 is similar to the example illustrated in FIG. 1 or 2.

The structure of the outer peripheral diode portion 85 is similar to the diode portion 80. In other words, the outer peripheral diode portion 85 includes the cathode region 82 in the lower surface 23 of the semiconductor substrate 10, the dummy trench portion 30 in the upper surface 21, the base region 14, and the like. Even with such a configuration, the density of the diode portion 80 in the vicinity of the center position 104 of the semiconductor substrate 10 can be reduced.

Figure 8:
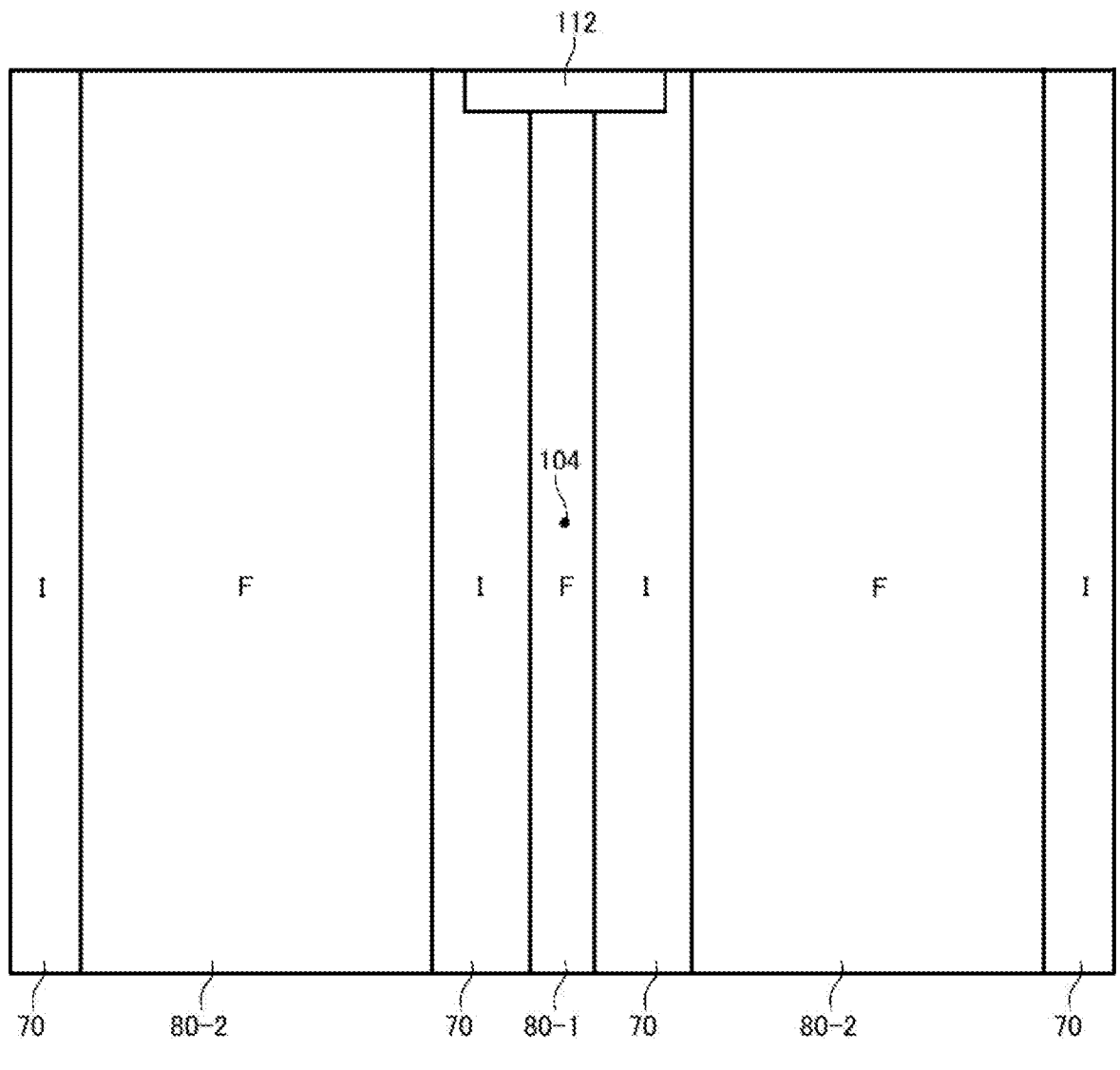
FIG. 8 is a diagram illustrating another arrangement example of the diode portion 80 and the transistor portion 70 in an active portion 120.

FIG. 8 is a diagram illustrating another arrangement example of the diode portion 80 and the transistor portion 70 in the active portion 120. The active portion 120 of this example includes a diode portion 80-1 and a diode portion 80-2. The diode portion 80-1 is provided in the region where the center position 104 is included. The center in the X axis direction of the diode portion 80-1 may be the center position 104. The width Wf of the diode portion 80-1 is similar to the diode portion 80 described in FIGS. 1 to 7.

The diode portion 80-2 is disposed on the edge side 102 side of the semiconductor substrate 10 in the X axis direction than the diode portion 80-1. In other words, the diode portion 80-2 is disposed in the end portion in the X axis direction of the active portion 120. The width Wf of the diode portion 80-2 is the same as the first width W1 of the transistor portion 70 or larger than the width W1. Two diode portions 80-2 may be disposed to interpose the diode portion 80-1 in the X axis direction. The transistor portion 70 is disposed to interpose each diode portion 80.

According to this example, the density of the diode portion 80 in the vicinity of the center position 104 is reduced, so that the heat generation in the vicinity of the center position 104 can be suppressed. In addition, the width Wf of the diode portion 80-2 is set to be large, so that the boundary region between the transistor portion 70 and the diode portion 80 can be reduced, and the diode loss can be improved. Further, the diode portion 80-1 may be not provided. Instead of the diode portion 80-1, the transistor portion 70 may also be provided.

Figure 9:
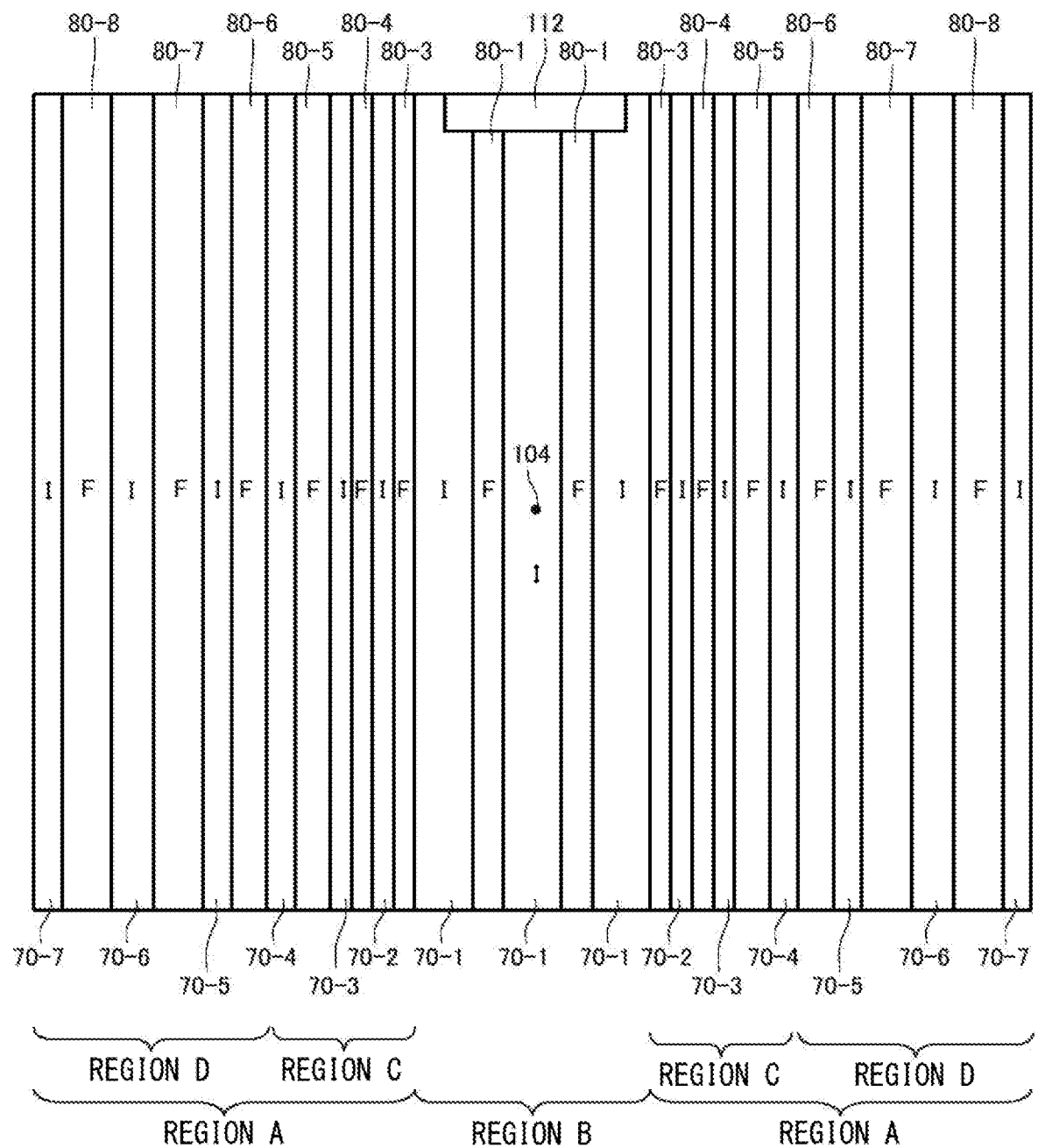
FIG. 9 is a diagram illustrating another arrangement example of the diode portion 80 and the transistor portion 70 in the active portion 120.

FIG. 9 is a diagram illustrating another arrangement example of the diode portion 80 and the transistor portion 70 in the active portion 120. The active portion 120 of this example includes Region A and Region B. Region B is a region which includes the center position 104. Region B is disposed on the edge side 102 side of the semiconductor substrate 10 in the X axis direction than Region A. In Region B, the diode portion 80-1 and the transistor portion 70-1 are disposed. The arrangement the diode portion 80-1 and the transistor portion 70-1 in Region B may be similar to the active portion 120 described in FIGS. 1 to 7.

In Region A, the diode portion 80 and the transistor portion 70 are alternately disposed along the X axis direction. In Region A of this example, the diode portions 80-3 to 80-8 are disposed from the center position 104 side toward the edge side 102 side. The widths Wf of the diode portions 80-3 to 80-8 increase as the distance from the center position 104 increases in the X axis direction. In addition, in Region A of this example, the transistor portions 70-2 to 70-7 are disposed from the center position 104 side toward the edge side 102 side. The first widths W1 of the plurality of transistor portions 70-2 to 70-6 provided in Region A increase as the distance from the center position 104 increases in the X axis direction. However, the first width W1 of the transistor portion 70-7 disposed at the farthest end in the X axis direction may also be smaller than the first width W1 of the adjacent transistor portion 70-6.

In Region A, the density of the diode portion 80 increases as the position is closer to the center position 104. In this example, the boundary between the transistor portion 70 and the diode portion 80 in Region A is large, so that the temperature difference between the transistor portion 70 and the diode portion 80 becomes small, and the chip heating temperature is lowered. In addition, the temperature in Region B tends to rise. However, it is possible to suppress the temperature rise as the entire chip since the heat generation in Region A is suppressed.

In addition, the width of the diode portion 80 of Region A becomes large as the position is closer to the edge side 102 of the semiconductor substrate 10. Therefore, the heat generation in Region C near the center position 104 in Region A can be suppressed. In Region C, the boundary region between the transistor portion 70 and the diode portion 80 is large, and the diode loss becomes worsen. However, the boundary region can be made small by extending the width of the diode portion 80 of Region D far from the center position 104 in Region A. Therefore, the diode loss can be improved. Accordingly, the loss deterioration in Region C can be covered by Region D, so that the trade-off between the number of diodes and the diode loss or the heat generation can be improved. Further, the diode portion 80-1 in Region B may be not provided. Further, the active-side gate runner 131 illustrated in FIG. 1 and the like may be provided even in FIGS. 8 and 9.

Figure 10:
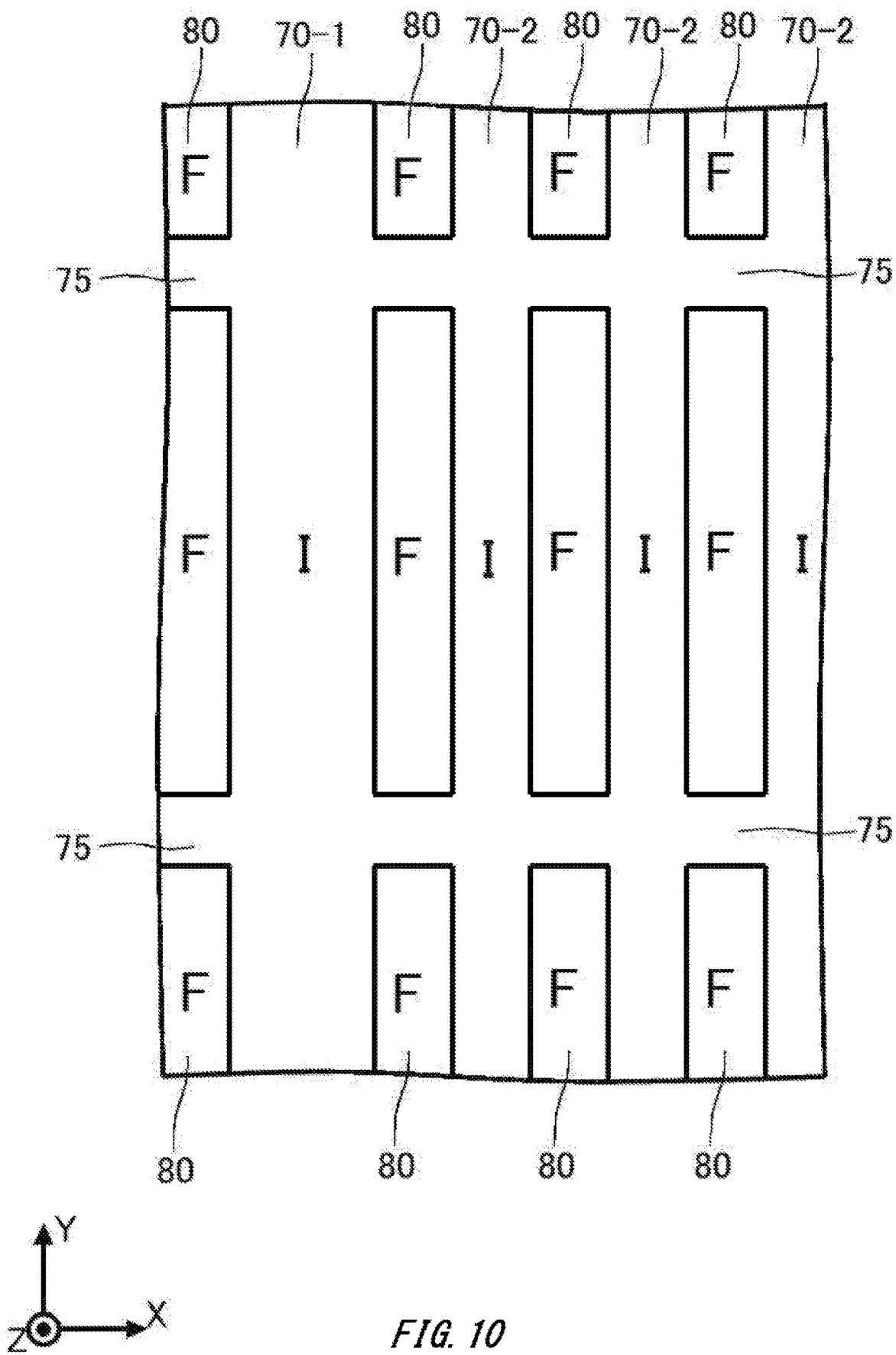
FIG. 10 is a diagram illustrating another structure example of the active portion 120.

FIG. 10 is a diagram illustrating another structure example of the active portion 120. In the active portion 120 of this example, a connection transistor portion 75 is further provided in addition to the structure described in FIGS. 1 to 9. The connection transistor portion 75 connects two transistor portions 70 adjacent in the X axis direction. The connection transistor portion 75 may be provided by extending in the X axis direction from one transistor portion 70 to the other transistor portion 70.

The diode portion 80 is divided in the Y axis direction by the connection transistor portion 75. In other words, at least one diode portion 80 has an island shape surrounded by the transistor portion 70 when viewed from the upper surface.

The island-shaped diode portions 80 may be disposed at a higher density as the distance from the center position 104 of the semiconductor substrate 10 increases. The density of the diode portion 80 is the area of the diode portion 80 which is included in the unit area of the upper surface of the semiconductor substrate 10. Even with such an arrangement, the density of the diode portion 80 in the vicinity of the center position 104 can be reduced.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

What is claimed is:

1. A semiconductor device, comprising:
a semiconductor substrate that is provided with a first conductivity type drift region;
a plurality of transistor portions, each including a second conductivity type collector region in contact with a lower surface of the semiconductor substrate; and
a plurality of diode portions, each including a first conductivity type cathode region in contact with the lower surface of the semiconductor substrate, and the plurality of diode portions being alternately disposed with the plurality of transistor portions along an arrangement direction in an upper surface of the semiconductor substrate,
wherein two or more sequentially selected transistor portions, sequentially selected from the plurality of transistor portions, each have a width in the arrangement direction that is larger than a width in the arrangement direction of each of one or more other transistor portions of the plurality of transistor portions, wherein the two or more sequentially selected transistor portions are located nearer to a center in the arrangement direction of the semiconductor substrate than the one or more other transistor portions.

2. The semiconductor device according to claim 1, wherein a value obtained by dividing the second width by the first width is larger than 0.5 and smaller than 1.

3. The semiconductor device according to claim 1, wherein the first width is larger than 700 μm and smaller than 1100 μm.

4. The semiconductor device according to claim 1, wherein a width in the arrangement direction of each of a plurality of the diode portions is larger than 300 μm.

5. The semiconductor device according to claim 1, wherein a width in the arrangement direction of each of the diode portions is larger than 2.5 times a thickness of the semiconductor substrate.

6. The semiconductor device according to claim 1, wherein each of the diode portions has the same width in the arrangement direction.

7. The semiconductor device according to claim 1, wherein the plurality of transistor portions further comprises one or more third transistor portions located further away from the center than the one or more other transistor portions, and
wherein the second width is larger than a width in the arrangement direction of each of the one or more third transistor portions.

8. The semiconductor device according to claim 1, further comprising:
an outer peripheral diode portion, in the upper surface of the semiconductor substrate, which is provided to surround a region where the transistor portion and the diode portion are alternately disposed along the arrangement direction.

9. The semiconductor device according to claim 1, further comprising:
a gate pad that is electrically connected to one or more of the plurality of transistor portions,
wherein a distance in the arrangement direction between the diode portion nearest to the gate pad and the gate pad is larger than a width in the arrangement direction of the diode portion.

10. The semiconductor device according to claim 1, wherein an oxygen concentration in the semiconductor substrate is $1.0 \times 10^{17}/\text{cm}^3$ or more.

11. The semiconductor device according to claim 10, further comprising:
a first conductivity type buffer region that is provided between the drift region and the lower surface of the semiconductor substrate, contains hydrogen, and has a plurality of concentration peaks having a doping concentration higher than the drift region in a depth direction of the semiconductor substrate.

12. The semiconductor device according to claim 11, wherein a crystal defect density distribution in the depth direction of the semiconductor substrate has a defect density peak that is disposed between the concentration peaks in the buffer region.

13. The semiconductor device according to claim 11, wherein a crystal defect density distribution in the depth direction of the semiconductor substrate has a defect density peak at a position where a distance from the lower surface of the semiconductor substrate is longer than that for one of the plurality of concentration peaks in the buffer region.

14. The semiconductor device according to claim 10, further comprising:
a first conductivity type buffer region that is provided between the drift region and the lower surface of the semiconductor substrate, contains phosphorus, and has concentration peaks having a doping concentration higher than the drift region in a depth direction of the semiconductor substrate.

* * * * *